United States Patent [19]
Bryant et al.

[11] Patent Number: 5,331,117
[45] Date of Patent: Jul. 19, 1994

[54] METHOD TO IMPROVE INTERLEVEL DIELECTRIC PLANARIZATION

[75] Inventors: Frank R. Bryant, Denton; Charles R. Spinner, III, Dallas, both of Tex.

[73] Assignee: SGS-Thomson Microelectronics, Inc., Carrollton, Tex.

[21] Appl. No.: 974,923

[22] Filed: Nov. 12, 1992

[51] Int. Cl.$^5$ ............................................. H05K 1/00
[52] U.S. Cl. .................................. 174/250; 174/256; 174/258; 257/510
[58] Field of Search ............... 174/250, 251, 256, 258; 257/213, 283, 284, 510; 361/313

[56] References Cited

U.S. PATENT DOCUMENTS 4,676,867  6/1987  Elkins et al. .
5,028,555  7/1991  Haskell .
5,032,694  7/1991  Ishihara et al. ................. 174/256
5,126,916  6/1992  Tseng ................................. 361/313

*Primary Examiner*—Leo P. Picard
*Assistant Examiner*—Cheryl R. Figlin
*Attorney, Agent, or Firm*—Kenneth C. Hill; Lisa K. Jorgenson; Richard K. Robinson

[57] ABSTRACT

A method is provided for forming a substantially planarized surface of an integrated circuit, and an integrated circuit formed according to the same. A conductive area is formed over a portion of a dielectric region. A first spin-on-glass layer is formed over the conductive area and exposed dielectric region. A second spin-on-glass layer is formed over the first spin-on-glass layer; wherein the second spin-on-glass layer has a slower etch rate than the first spin-on-glass layer. A partial etchback of the first and second spin-on-glass layers is performed forming a substantially planar surface.

9 Claims, 1 Drawing Sheet

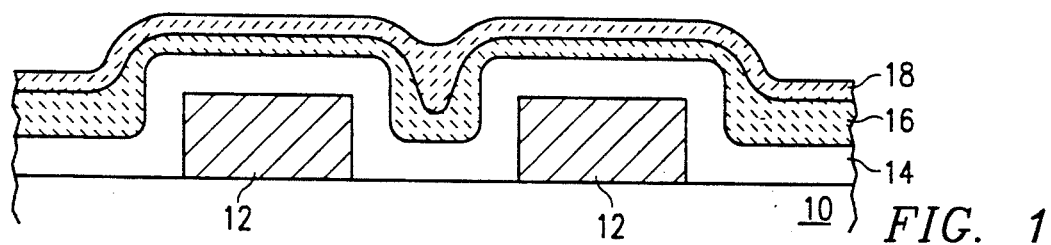
FIG. 1
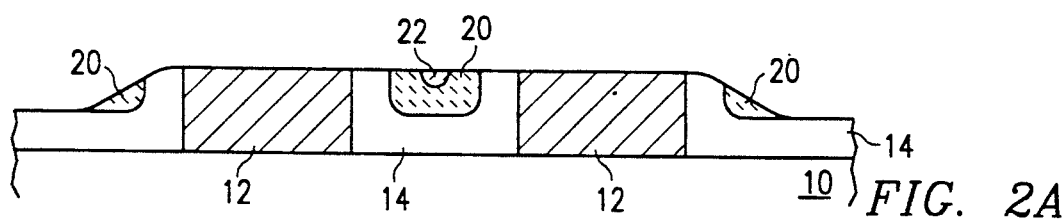
FIG. 2A
FIG. 2B
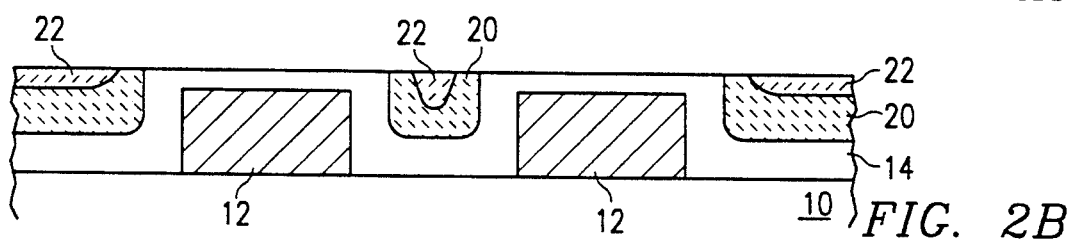
FIG. 3
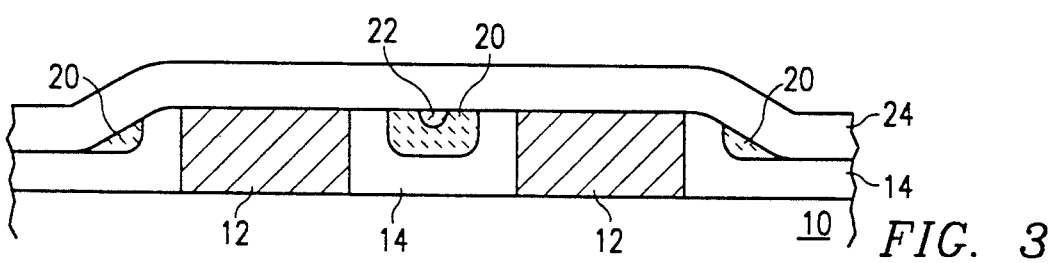
FIG. 4
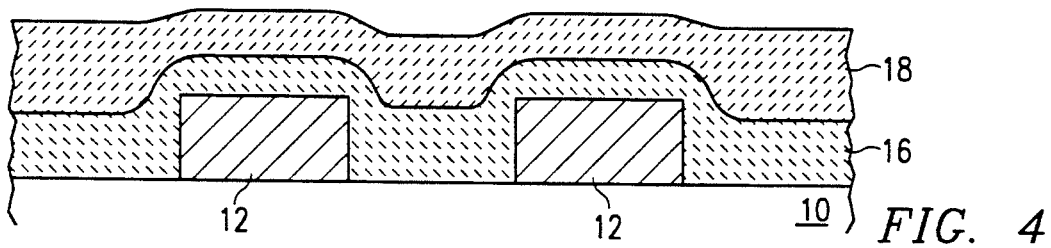
FIG. 5A
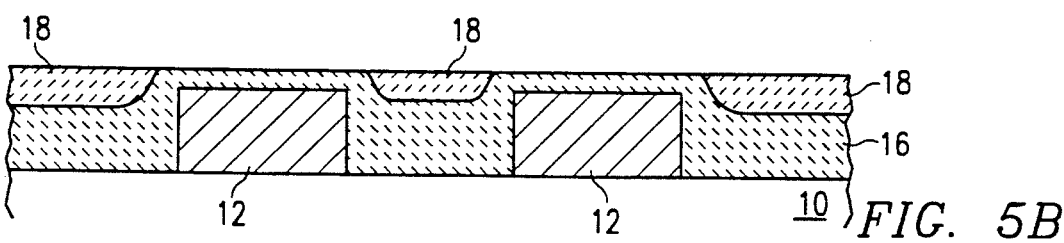
FIG. 5B

METHOD TO IMPROVE INTERLEVEL DIELECTRIC PLANARIZATION

FIELD OF THE INVENTION

The present invention relates generally to semiconductor integrated circuit processing, and more specifically to improving interlevel dielectric planarization.

BACKGROUND OF THE INVENTION

The manufacturing costs of integrated circuits are largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions. These geometries and sizes are often dependent upon the photolithographic resolution available for the particular manufacturing facility. The goal of photolithography in establishing the horizontal dimensions of the various devices and circuits is to create a pattern which meets design requirements as well as to correctly align the circuit pattern on the surface of the wafer. As line widths shrink smaller and smaller in submicron photolithography, the process to print lines and contact holes in photoresist becomes increasingly more difficult.

With circuit advancement to the very-large-scale integration (VLSI) levels, more and more layers are added to the surface the wafer. These additional layers in turn create more steps on the wafer surface. The resolution of small image sizes in photolithography thus becomes more difficult over the additional steps due to light reflection and the thinning of the photoresists over the steps. Planarization techniques are generally incorporated to offset the effects of a varied topography.

The fabrication of a circuit starts with a blank silicon substrate. The processing of the substrate requires a substantial number of manufacturing steps. A number of approaches are used in the art to make the surface of the different portions of the integrated circuit more smooth. These approaches will make it easier to provide smooth and well-formed subsequent layers. These techniques are generally referred to as planarization.

The thickness of the various layers are dictated by a number of considerations, such as providing a reasonable margin of insulation between conductive layers, or for metal layers, providing sufficient current-carrying capacity. Since the layers cannot be made arbitrarily thin, it is necessary to do something to make the top surface of lower layers more smooth (or more planar) in order to provide a proper base for subsequent layers.

In the prior art, various spin-on-glass (SOG) processes have been used to help planarize interlevel dielectric layers. These processes, however, have proven inadequate for today's sub-micron technologies. One problem in the prior art is the poor quality of filling of small space geometries. This poor filling is caused, in part, by local SOG volumetric limitations as well as surface tension effects which tend to drag the SOG out of filled spaces during the spinning process.

It is therefore an object of this invention to provide a method of improving the planarization of the surface of the integrated circuit.

It is a further object of this invention to improve planarization through the use of two SOG layers, preferably having different etch rates.

It is a further object of this invention to provide such a method which utilizes conventional process flows.

Other objects and advantages of the invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby, by forming a conductive area over a dielectric region. Selected portions of the conductive area are etched to form a plurality of conductive regions exposing a portion of the dielectric region. A conformal dielectric layer is formed over the conductive regions and exposed dielectric region. A first spin-on-glass layer is formed over the conformal dielectric layer. A second spin-on-glass layer is formed over the first spin-on-glass layer; wherein the second spin-on-glass layer has a slower etch rate than the first spin-on-glass layer. A partial etchback of the first and second spin-on-glass layers is performed wherein a portion of the conformal dielectric layer is exposed, forming a substantially planar surface.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1-3 are cross sectional views of the fabrication of a semiconductor integrated circuit according to the present invention.

FIGS. 4-5B are cross sectional views of an alternative embodiment of the fabrication of a semiconductor integrated circuit according to the present invention.

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring to FIG. 1, an integrated circuit is to be formed on an insulating layer 10. Insulating layer 10 may be an interlevel dielectric layer such as BPSG, borophosphorous silicate glass, or PSG, phosphorous silicate glass. A conductive layer is formed over the insulating layer 10, patterned and etched to form conductive regions 12. The conductive layer has a thickness of between approximately 1000 to 10000 angstroms. These conductive regions preferably form metal signal lines. For ease of explanation, these regions will be referred to as metal signal lines throughout the description.

In the preferred embodiment, a conformal dielectric layer 14 is formed over the metal signal lines 12 and the insulating layer 10 not covered by the metal signal lines 12. The conformal dielectric layer 14 is typically a doped or undoped silicon dioxide. A first spin-on-glass (SOG) layer 16 is spun onto the conformal dielectric layer 14. This first SOG layer is formed to a depth of between approximately 500 to 8000 angstroms to bulk fill the areas between the metal signal lines 12. At this point, the first SOG layer may be cured to enhance the SOG's resistance to cracking. A second SOG layer 18 is next spun onto the first SOG layer 16 for smoothness or to enhance the planarity of the surface of the integrated circuit. The second SOG layer will typically have a thickness of between 500 to 8000 angstroms also. This second SOG layer may also be cured before subsequent processing steps are performed.

Referring to FIG. 2A, a partial etchback of the first and second SOG layers 16 and 18 is performed, preferably by a plasma etchback. The etchback is typically stopped at an upper surface of the metal signal lines 12 which also exposes portions of the conformal dielectric layer 14 as shown. Alternatively, the etchback may be stopped prior to reaching the upper surface of the metal signal lines 12, as shown in FIG. 2B. In this case, a portion of the dielectric layer 14 will remain over the upper surface of the metal signal lines 12. A portion of the second SOG layer 22 may also remain over the first SOG layer 20 on either side of the metal signal lines 12. If the SOG layers 20, 22 have not yet been cured, these layers may be cured at this stage before any subsequent processing steps.

A single layer of SOG may not be able to adequately fill in the areas between the metal signal lines. The use of two SOG layers, as in the present invention, one for bulk filling and one for smoothing, will enhance planarization. The second SOG layer's viscosity typically will be lower than that for the first SOG layer to allow the second SOG layer to fill in the smaller areas or holes. To further enhance planarization, the SOG etch rates will typically be different to achieve both the bulk filling and smoothing of the surface of the integrated circuit.

In the preferred embodiment, one of the key features of the present invention is that the etch rate of the second SOG layer 18 will be slower than the etch rate of the first SOG layer 16. Typically, the etch rate of the first SOG layer 16 will be similar to or slower than the underlying silicon dioxide layer 14. The slower etch rate of the second SOG layer 18 will effectively smooth out or planarize the local areas that need to remain filled, i.e., the areas not filled by the first SOG layer. Various types of SOG may be selected having the desired and different etch rates such as cross linking polymer chains or silicates.

Referring to FIG. 3, an insulating layer 24 is typically formed over the metal signal lines 12 and the remaining SOG layers 20, 22 as well as the exposed conformal dielectric layer 14. The surface is substantially planar to provide for smooth and well-formed subsequent layers.

Referring to FIG. 4, an alternative preferred embodiment is shown. While it is preferable to form the conformal dielectric layer 14 (as shown in FIG. 1) to prevent the first SOG layer from being formed directly on the metal signal lines, layer 14 may not be necessary in all applications. After the metal signal lines 16 are formed, the first SOG layer 16 is spun onto the areas 16 and the exposed portions of the insulating layer 10. The second SOG layer 18 is then spun onto the first SOG layer 16. Each of these SOG layers may be cured as described above before subsequent process steps are performed.

Referring to FIG. 5A, an etchback of the first and second SOG layers 16 and 18 is performed, preferably by a plasma etchback as described above. The etchback is again typically stopped at an upper surface of the metal signal lines 12. A portion of both SOG layers 16, 18 remains. As in the preferred embodiment described above, one of the key features of the present invention is that the etch rate of the second SOG layer will be slower than the etch rate of the first SOG layer to effectively smooth out or planarize the local areas that need to remain filled. Referring to FIG. 5B, the etch back process may also be stopped before reaching the upper surface of the metal signal lines 12, as shown.

While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of a semiconductor device, comprising:
    a conductive structure disposed over a portion of a dielectric region;
    a conformal dielectric layer disposed adjacent to the conductive structure and disposed over the dielectric region, the conformal dielectric layer having an upper surface adjacent the conductive structure which is lower than an upper surface of the conductive structure; and
    a first spin-on-glass region disposed on the conformal dielectric layer upper surface, having an upper surface lower than the conductive structure upper surface, and having a first etch rate; and
    a second spin-on-glass region disposed on the first spin-on-glass region upper surface, having an upper surface approximately coplanar with the conductive structure upper surface, and having a second etch rate which is slower than the first etch rate.

2. The structure of claim 1, wherein the conductive structure is a plurality of metal signal lines.

3. The structure of claim 1, wherein the conformal dielectric layer is further disposed over an upper surface of the conductive structure.

4. The structure of claim 1, further comprising:
    an interlevel dielectric layer disposed over the spin-on-glass regions, the conductive structure, and the conformal dielectric layer.

5. A structure consisting of a portion of a semiconductor device, comprising:
    a plurality of conductive regions disposed over a portion of a dielectric region;
    a plurality of first spin-on-glass regions disposed adjacent to the conductive regions and disposed over the exposed dielectric region; and
    a plurality of second spin-on-glass regions having a different chemical composition and etch rate from the first spin-on-glass regions and disposed along selected areas of the upper surface of the first spin-on-glass regions forming a substantially planar surface.

6. The structure of claim 5, wherein a portion of the first spin-on-glass regions are further disposed over an upper surface of the conductive regions.

7. The structure of claim 1, wherein the first etch rate is approximately the same as an etch rate of the conformal dielectric layer.

8. The structure of claim 1, wherein the first etch rate is slower than an etch rate of the conformal dielectric layer.

9. The structure of claim 5, wherein the etch rate of the second spin-on-glass regions is slower than the etch rate of the first spin-on-glass regions.

* * * * *